United States Patent
Li et al.

(10) Patent No.: US 11,362,294 B2
(45) Date of Patent: Jun. 14, 2022

(54) ORGANIC LIGHT-EMITTING DIODE AND DISPLAY PANEL

(71) Applicant: Yungu (Gu'an) Technology Co., Ltd., Langfang (CN)

(72) Inventors: Weiwei Li, Langfang (CN); Chao Chi Peng, Langfang (CN); Lin He, Langfang (CN); Jingwen Tian, Langfang (CN); Tiantian Li, Langfang (CN); Mengzhen Li, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 44 days.

(21) Appl. No.: 16/865,741

(22) Filed: May 4, 2020

(65) Prior Publication Data

US 2020/0266375 A1    Aug. 20, 2020

Related U.S. Application Data

(63) Continuation of application No. PCT/CN2019/071949, filed on Jan. 16, 2019.

(30) Foreign Application Priority Data

Sep. 18, 2018 (CN) .......................... 201821525618.X

(51) Int. Cl.
*H01L 51/50* (2006.01)
*H01L 27/32* (2006.01)

(52) U.S. Cl.
CPC ...... *H01L 51/5004* (2013.01); *H01L 27/3244* (2013.01); *H01L 51/5096* (2013.01); *H01L 2251/552* (2013.01); *H01L 2251/558* (2013.01)

(58) Field of Classification Search
CPC ................................................ H01L 2251/552
See application file for complete search history.

(56) References Cited

U.S. PATENT DOCUMENTS

| | | | |
|---|---|---|---|
| 2003/0059647 A1* | 3/2003 | Thompson | H01L 51/5096 257/88 |
| 2006/0175957 A1 | 8/2006 | Suzuri et al. | |
| 2009/0191427 A1* | 7/2009 | Liao | H01L 51/5096 428/690 |

FOREIGN PATENT DOCUMENTS

| | | |
|---|---|---|
| CN | 101128559 A | 2/2008 |
| CN | 101978528 A | 2/2011 |

OTHER PUBLICATIONS

ISR_for_International_Application_PCT/CN2019/071949.
CN 101978528 A_Abstract English Translation.
CN 101128559 A_Abstract English Translation.

* cited by examiner

*Primary Examiner* — Moin M Rahman
*Assistant Examiner* — Mohammad A Rahman
(74) *Attorney, Agent, or Firm* — Ladas & Parry LLP

(57) ABSTRACT

Provided is an organic light-emitting diode. The organic light-emitting diode includes a first electrode, a second electrode, a light-emitting layer and a hole blocking layer, where the first electrode and the second electrode are oppositely disposed; the light-emitting layer is disposed between the first electrode and the second electrode; the hole blocking layer is disposed between the light-emitting layer and the second electrode; and the hole blocking layer includes at least two hole blocking sub-layers which are stacked, where a lowest unoccupied molecular orbital (LUMO) energy level decreases sequentially in the at least two hole blocking sub-layers.

15 Claims, 6 Drawing Sheets

ORGANIC LIGHT-EMITTING DIODE AND DISPLAY PANEL

CROSS-REFERENCE TO RELATED APPLICATIONS

This is a continuation of International Patent Application No. PCT/CN2019/071949 filed on Jan. 16, 2019, which claims priority to a Chinese patent application No. 201821525618.X filed on Sep. 18, 2018, contents of both of which are incorporated herein by reference in their entireties.

TECHNICAL FIELD

The present application relates to the technical field of display and, particularly, to an organic light-emitting diode and a display panel.

BACKGROUND

An organic light-emitting diode (OLED) uses a light-emitting mechanism of auto-luminescence and does not require a backlight. When the OLED is applied to a display panel and a display device, the overall thickness of the display panel and the display device is relatively small, thereby facilitating the light and thin design of the display panel and the display device.

Meanwhile, the OLED has advantages of high display brightness, a wide view angle, a high response speed and the like.

However the existing OLED has a short service life.

SUMMARY

The present application provides an OLED and a display panel to improve a service life of the OLED.

The present application provides an OLED. The OLED includes a first electrode, a second electrode, a light-emitting layer and a hole blocking layer. The first electrode and the second electrode are oppositely disposed. The light-emitting layer is disposed between the first electrode and the second electrode. The hole blocking layer is disposed between the light-emitting layer and the second electrode. The hole blocking layer includes at least two hole blocking sub-layers which are stacked, where the lowest unoccupied molecular orbital (LUMO) energy level decreases sequentially in the at least two hole blocking sub-layers.

Furthermore, along a direction from the light-emitting layer to the second electrode, the LUMO energy level decreases sequentially in the at least two hole blocking sub-layers, and the highest occupied molecular orbital (HOMO) energy level decreases sequentially in the at least two hole blocking sub-layers.

A LUMO energy level of any one of the at least two hole blocking sub-layers is lower than a LUMO energy level of the light-emitting layer.

Furthermore, along a direction from the second electrode to the light-emitting layer, the LUMO energy levels of the at least two hole blocking sub-layers are sequentially reduced, and HOMO energy levels of the at least two hole blocking sub-layers are sequentially reduced.

A LUMO energy level of any one of the at least two hole blocking sub-layers is less than a LUMO energy level of the light-emitting layer.

Furthermore, an energy level difference L1 between LUMO energy levels of two adjacent hole blocking sub-layers among the at least two hole blocking sub-layers satisfies: $L1 \leq 0.15$ eV. Further, the energy level difference L1 between the LUMO energy levels of the two adjacent hole blocking sub-layers among the at least two hole blocking sub-layers satisfies: $L1 \leq 0.1$ eV.

Furthermore, an energy level difference L2 between a LUMO energy level of the light-emitting layer and the LUMO energy level of one hole blocking sub-layer with a highest LUMO energy level among the at least two hole blocking sub-layers satisfies: $L2 \leq 0.1$ eV. A hole blocking sub-layer with the highest LUMO energy level is one of the at least two hole blocking sub-layers whose LUMO energy level is closest to the LUMO energy level of the light-emitting layer.

Furthermore, the energy level difference L2 between the LUMO energy level of the light-emitting layer and the LUMO energy level of the hole blocking sub-layer with the highest LUMO energy level among the at least two hole blocking sub-layers satisfies: $L2 \leq 0.08$ eV.

Furthermore, in the hole blocking layer, an energy level difference H1 between a HOMO energy level of at least one of the at least two hole blocking sub-layers and a HOMO energy level of the light-emitting layer has a value range: $0.2 \text{ eV} \leq H1 \leq 0.5$ eV.

Furthermore, in the hole blocking layer, the energy level difference H1 between the HOMO energy level of the at least one of the at least two hole blocking sub-layers and the HOMO energy level of the light-emitting layer has a value range: $0.3 \text{ eV} \leq H1 \leq 0.4$ eV.

Furthermore, a thickness T1 of any one of the at least two hole blocking sub-layers has a value range: $0 \text{ nm} < T1 \leq 5$ nm.

Furthermore, the thickness T1 of any one of the at least two hole blocking sub-layers has a value range: $0 \text{ nm} \leq T1 \leq 3.5$ nm.

Furthermore, a thickness T2 of one of the at least two hole blocking sub-layers which abuts against the light-emitting layer has a value range: $2 \text{ nm} \leq T2 \leq 3$ nm.

Furthermore, the thickness T2 of the one of the at least two hole blocking sub-layers which abuts against the light-emitting layer has a value range: $2.3 \text{ nm} \leq T2 \leq 2.8$ nm.

Furthermore, the OLED further includes a first carrier functional layer and a second carrier functional layer.

The first carrier functional layer is disposed between the first electrode and the light-emitting layer. The second carrier functional layer is disposed between the hole blocking layer and the second electrode.

The present application further provides a display panel. The display panel includes a substrate and a plurality of pixel units disposed on a side of the substrate and arranged in an array. Each of the plurality of pixel units includes any one of the above OLEDs provided by the present application.

DETAILED DESCRIPTION

In the related art, a light-emitting layer of an OLED with excellent performance tends to be made of an electron transport type material, and the OLED further includes a first electrode and a second electrode which are disposed on two sides of the light-emitting layer. Exemplarily, the first electrode may be an anode, and the second electrode may be a cathode. When the OLED is provided with a driving current, electrons are injected into the light-emitting layer from the second electrode, and holes are injected into the light-emitting layer from the first electrode. Since the light-emitting layer tends to be made of the electron transport type material, the material of the light-emitting layer facilitates the transport of electrons, and thus a large number of electrons reach the light-emitting layer, thereby improving the current efficiency of the OLED. However, when the number of electrons in the light-emitting layer is much greater than the number of holes in the light-emitting layer, excessive electrons cannot be recombined, and the excessive electrons that cannot be recombined are transported to films between the light-emitting layer and the first electrode, which will damage performance of the films and interfaces between adjacent films; therefore, the performance of the films between the light-emitting layer and the first electrode in the OLED are degraded, and the interfaces between the adjacent films among multiple films between the light-emitting layer and the first electrode are damaged, thereby causing a decrease of a service life of the OLED, that is, the OLED has a shorter service life.

The present application provides an OLED to improve the service life of the OLED.

Figure 1:
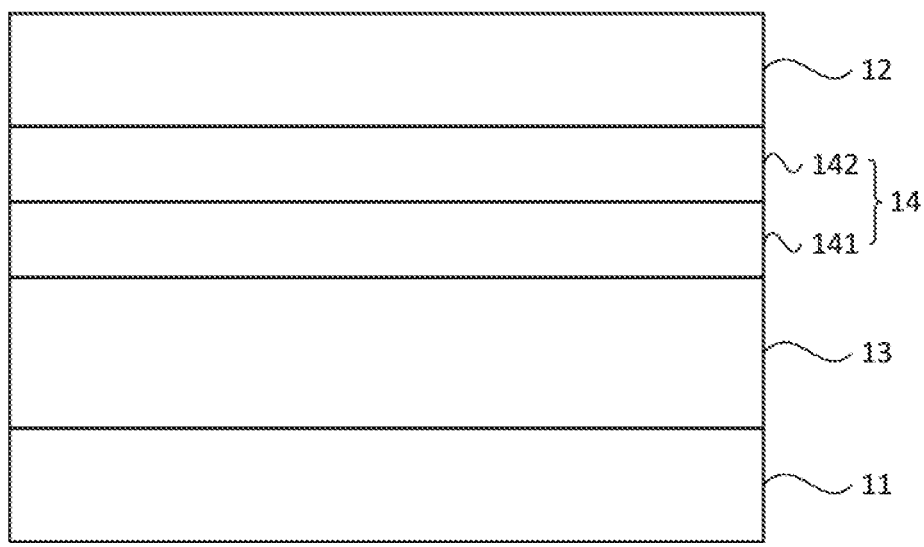
FIG. 1 is a structural diagram of an OLED according to an embodiment.

FIG. 1 is a structural diagram of an OLED according to an embodiment. Referring to FIG. 1, an OLED 10 includes a first electrode 11, a second electrode 12, a light-emitting layer 13 and a hole blocking layer 14; where the first electrode 11 and the second electrode 12 are oppositely disposed; the light-emitting layer 13 is disposed between the first electrode 11 and the second electrode 12; the hole blocking layer 14 is disposed between the light-emitting layer 13 and the second electrode 12; and the hole blocking layer 14 includes at least two hole blocking sub-layers (exemplarily, in the OLED 10 shown in FIG. 1, the hole blocking layer 14 includes two hole blocking sub-layers, which are separately shown as a first hole blocking sub-layer 141 and a second hole blocking sub-layer 142, and the first hole blocking sub-layer 141 is disposed on a side of the second hole blocking sub-layer 142 facing towards the light-emitting layer 13) which are stacked, where the LUMO energy level decreases sequentially in the at least two hole blocking sub-layers (shown as the first hole blocking sub-layer 141 and the second hole blocking sub-layer 142 in FIG. 1).

The first electrode 11 may be an anode. Exemplarily, a material of the first electrode 11 may be indium tin oxide (ITO). The second electrode 12 may be a cathode. Exemplarily, a material of the second electrode 12 may be a metal material, for example, a conductive material with a low work function, such as aluminum (Al), gold (Au), silver (Ag) or a metal alloy including Ag. The light-emitting layer 13 may include a host material and a guest material. Exemplarily, the host material may be 8-hydroxyquinoline aluminum (Alq3), 9,10-Di(1-naphthyl) anthracene (ADN), and 4,4'-Di (9H-carbazol-9-yl)-1,1'-biphenyl (CBP); the guest material may be 2-tert-butyl-4-(Dicyanomethylene)-6-[2-(1, 1,7,7-tetramethyljulolidin-9-yl)vinyl]-4H-pyran (DCJBT), N,N'-Dimethylquinacridone (DMQA), N,N'-Dibutylquinacridone (DBQA), coumarin 545T (C545T), 5,12-Dibutyl-1, 3,8,10-tetramethylquinacridone (TMDBQA), 4,4'-Bis(9-ethyl-3-carbazovinylene)-1,1'-biphenyl (BCzVBi), 4,4'-Bis [4-(di-p-tolylamino)styryl]biphenyl (DPAVBi), 1,4'-Bis[4-(di-p-tolylamino)styryl]phenyl (DPAVB), and 3,3'-(1,4-Phenylenedi-2,1-ethenediyl)bis(9-ethyl-9H-carbazole) (BCZVB). The above materials are merely illustrative, and the materials of the first electrode 11 and the second electrode 12 are not limited in the present application.

A light-emitting principle of the OLED 10 mainly includes four processes including carrier (which may be an electron or a hole) injection, carrier transport, carrier recombination, and exciton de-excitation light emission. Specifically, when a certain voltage (which may also be understood as providing a driving current) is applied to the OLED 10, holes of the first electrode 11 (anode) and electrons of the second electrode 12 (cathode) are separately injected into the light-emitting layer 13 (which is a carrier injection process); the injected electrons and holes are transported under the action of an electric field (which is a carrier transport process); the electrons and the holes are recombined in the light-emitting layer 13 under a Coulomb action to generate excitons (which is a carrier recombination process); when the excitons return from an excited state to a ground state, the excitons release photons to emit light (which is an exciton de-excitation light emission process).

The hole blocking layer 14 is disposed between the light-emitting layer 13 and the second electrode 12 (cathode) and its function is mainly embodied in two aspects: on one hand, the transport of holes from the light-emitting layer 13 to the second electrode 12 can be blocked, so that more holes can be confined in the light-emitting layer 13; on the other hand, the transport of electrons from the second electrode 12 to the light-emitting layer 13 is facilitated, so that the number of electrons in the light-emitting layer 13 can be increased. A material of the hole blocking layer 14 may be ((1,1'-diphenyl)-4-olato) bis (2-methyl-8-hydroxyquinoline NI, 08) aluminum (BAlq), 2,9-dimethyl-4, 7-diphenyl-1, 10-phenanthroline (BCP), bis [2-((oxo) diphenylphosphino) phenyl] ether (DPEPO), 4, 7-diphenyl-1, 10-phenanthroline (Bphen), or other hole blocking layer materials known to those skilled in the art, which is not limited in the the embodiments of the present application.

The hole blocking layer 14 is configured to include at least two hole blocking sub-layers, and the at least two hole blocking sub-layers use hole blocking layer materials with different LUMO energy levels, so that a LUMO energy level of the single-layer hole blocking layer in the related art can be divided into at least two LUMO energy levels with a smaller energy level difference. Since the smaller LUMO energy level difference is more conducive to the transport of electrons, more electrons can be injected into the light-emitting layer 13 through the above arrangement. Meanwhile, an electron transport function and a hole blocking function of the hole blocking layer 14 are complementary, that is, the stronger the electron transport function of the hole blocking layer 14, the stronger the hole blocking function of the hole blocking layer 14. Therefore, the transport of holes from the light-emitting layer 13 to the second electrode 12 can be blocked through the above arrangement, and thus more holes are confined in the light-emitting layer 13. In summary, through the above arrangement, the number of electrons and the number of holes in the light-emitting layer 13 can both be increased, so that more electrons and holes are recombined in the light-emitting layer 13 for emitting light, thereby improving the light-emitting efficiency of the OLED 10. Meanwhile, since more electrons are recombined in the light-emitting layer 13, the damage of electrons to the films between the light-emitting layer 13 and the first electrode 11 and the interface between the adjacent films can be reduced, the performance degradation of the films and the performance degradation of the interface between the adjacent films can be slowed, so that the service life of the OLED 10 can be improved.

Exemplarily, referring to FIG. 1, the hole blocking layer 14 includes the first hole blocking sub-layer 141 and the second hole blocking sub-layer 142, where a LUMO energy level of the first hole blocking sub-layer 141 is lower than a LUMO energy level of the second hole blocking sub-layer 142. In this structure, a material of the first hole blocking sub-layer 141 may be Bphen, and a material of the second hole blocking sub-layer 142 may be BCP. Alternatively, the LUMO energy level of the second hole blocking sub-layer 142 is lower than the LUMO energy level of the first hole blocking sub-layer 141. In this case, the material of the first hole blocking sub-layer 141 may be BCP and the material of the second hole blocking sub-layer 142 may be Bphen. The first hole blocking sub-layer 141 and the second hole blocking sub-layer 142 may also be made of other hole blocking layer materials known to those skilled in the art, which is not limited in the embodiments of the present application.

Figure 2:
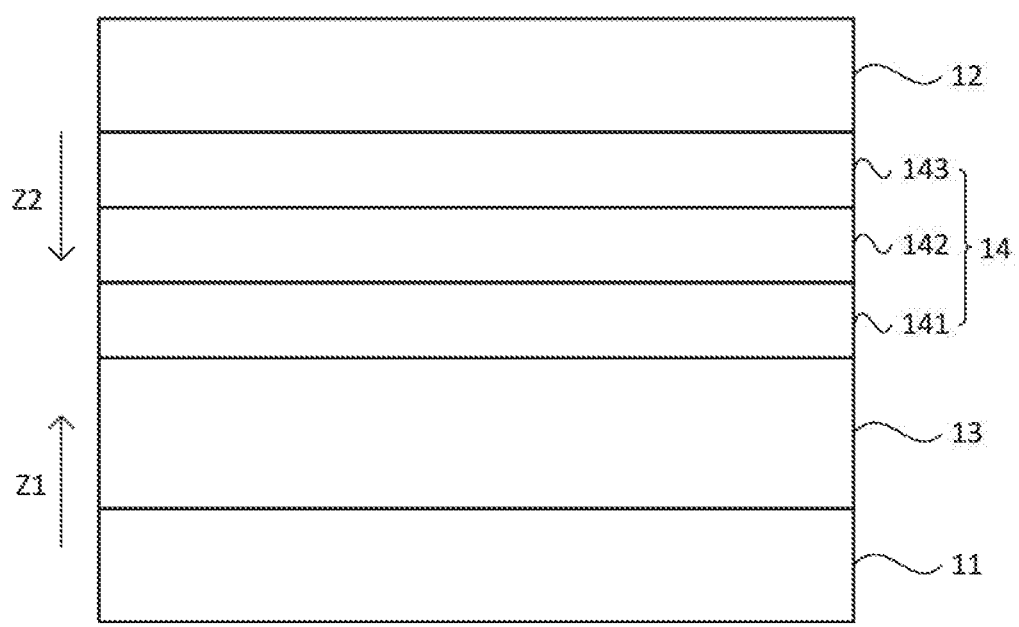
FIG. 2 is a structural diagram of an OLED further comprises the third hole blocking sub-layer according to another embodiment.

Exemplarily, FIG. 2 is a structural diagram of an OLED according to another embodiment. Referring to FIG. 2, the hole blocking layer 14 includes three hole blocking sub-layers, which are separately the first hole blocking sub-layer 141, the second hole blocking sub-layer 142 and a third hole blocking sub-layer 143. The LUMO energy level of the first hole blocking sub-layer 141 is lower than the LUMO energy level of the second hole blocking sub-layer 142, both of which are lower than a LUMO energy level of the third hole blocking sub-layer 143. In this structure, the material of the first hole blocking sub-layer 141 may be Bphen, the material of the second hole blocking sub-layer 142 may be BCP, and a material of the third hole blocking sub-layer 143 may be BAlq. Alternatively, the LUMO energy level of the third hole blocking sub-layer 143 is lower than the LUMO energy level of the second hole blocking sub-layer 142, both of which are lower than the LUMO energy level of the first hole blocking sub-layer 141. In this case, the material of the first hole blocking sub-layer 141 may be BAlq, the material of the second hole blocking sub-layer 142 may be BCP, and the material of the third hole blocking sub-layer 143 may be Bphen. The first hole blocking sub-layer 141, the second hole blocking sub-layer 142 and the third hole blocking sub-layer 143 may also be made of other hole blocking layer materials known to those skilled in the art, which is not limited in the embodiments of the present application.

FIG. 1 merely exemplarily shows that the hole blocking layer 14 includes two hole blocking sub-layers, and FIG. 2 merely exemplarily shows that the hole blocking layer 14 includes three hole blocking sub-layers, both of which are exemplary descriptions rather than limitations on the OLED 10 provided by the embodiments of the present application. In other implementations, the number of hole blocking sub-layers included in the hole blocking layer 14 may be set according to practical requirements of the OLED 10, which is not limited in the embodiments of the present application.

Secondly, each film of the OLED 10 may be formed by evaporation, sputtering, inkjet printing or other film forming manners known to those skilled in the art, which is not limited in the embodiments of the present application.

In addition, in the present application, the relative higher and lower levels of the LUMO energy level and the HOMO energy level of the multiple films may be understood in the following way: an energy level in an ionized state (the lowest energy level is called the ground state, and other energy levels are called the excited state; a state in which an electron is "far away from" from a nucleus and is no longer attracted by the nucleus is called the ionized state whose energy level is 0) is used as a reference energy level, an energy level closer to the reference energy level is the relatively higher energy level, and an energy level farther from the reference energy level is the relatively lower energy level.

In the embodiments of the present application, the hole blocking layer 14 is configured to include at least two hole blocking sub-layers and the LUMO energy level decreases sequentially in the at least two hole blocking sub-layers, so that the LUMO energy level of the hole blocking layer in the related art can be divided into at least two LUMO energy levels with the smaller energy level difference, thereby facilitating the transport of electrons to the light-emitting layer 13 and effectively blocking the transport of holes from the light-emitting layer 13 to the second electrode 12, In this way, the number of electrons and the number of holes in the light-emitting layer 13 are increased, more electrons and holes are recombined in the light-emitting layer 13 for emitting light, and the light-emitting efficiency of the OLED 10 is improved. Meanwhile, since more electrons are recombined, the damage of the electrons to the films between the light-emitting layer 13 and the first electrode 11 and the interface between the adjacent films can be reduced, so that the service life of the OLED 10 can be improved while the light-emitting efficiency of the OLED 10 is improved.

Figure 3:
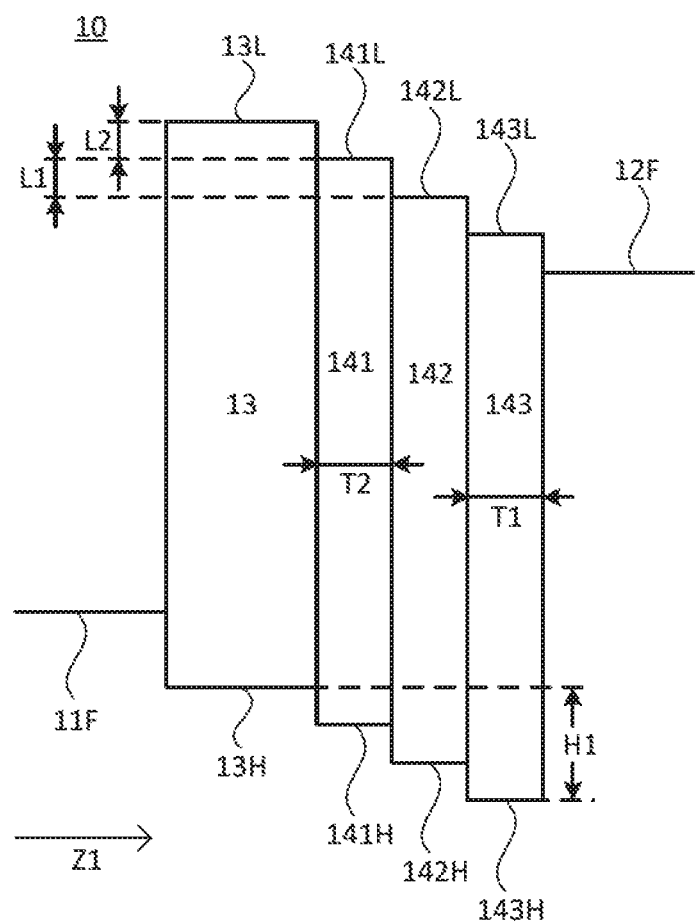
FIG. 3 is a schematic diagram of an energy level structure of an OLED according to an embodiment.

FIG. 3 is a schematic diagram of an energy level structure of an OLED according to an embodiment. In conjunction with FIG. 2 and FIG. 3, along a direction Z1 from the light-emitting layer 13 to the second electrode 12, the LUMO energy level decreases sequentially in the at least two hole blocking sub-layers (the OLED 10 shown in FIG. 2 and FIG. 3 include three hole blocking sub-layers, which are shown as the first hole blocking sub-layer 141, the second hole blocking sub-layer 142 and the third hole blocking sub-layer 143), and the HOMO energy level decreases sequentially in the at least two hole blocking sub-layers (shown as the first hole blocking sub-layer 141, the second hole blocking sub-layer 142 and the third hole blocking sub-layer 143 in FIG. 2 and FIG. 3); and a LUMO energy level of any one of the at least two hole blocking sub-layers is lower than a LUMO energy level of the light-emitting layer 13.

The LUMO energy level 141L of the first hole blocking sub-layer 141 is higher than the LUMO energy level 142L of the second hole blocking sub-layer 142, and the LUMO energy level 142L of the second hole blocking sub-layer 142 is higher than the LUMO energy level 143L of the third hole blocking sub-layer 143; meanwhile, the LUMO energy level 143L of the third hole blocking sub-layer 143 is higher than a Fermi energy level 12F of the second electrode 12, and the LUMO energy level 141L of the first hole blocking sub-layer 141 is lower than the LUMO energy level 13L of the light-emitting layer 13. A HOMO energy level 141H of the first hole blocking sub-layer 141 is higher than a HOMO energy level 142H of the second hole blocking sub-layer 142, and the HOMO energy level 142H of the second hole blocking sub-layer 142 is higher than a HOMO energy level 143H of the third hole blocking sub-layer 143; meanwhile, the HOMO energy level 141H of the first hole blocking sub-layer 141 is lower than a HOMO energy level 13H of the light-emitting layer 13, and the HOMO energy level 13H of the light-emitting layer 13 is lower than a Fermi energy level 11F of the first electrode 11.

With this arrangement, the LUMO energy level of the hole blocking layer is divided into stepwise changing LUMO energy levels of the three hole blocking sub-layers. By reducing a LUMO energy level difference between adjacent films, more electrons can be injected from the second electrode 12 into the light-emitting layer 13 through the third hole blocking sub-layer 143, the second hole blocking sub-layer 142 and the first hole blocking sub-layer 141 sequentially. Meanwhile, the transport of holes from the light-emitting layer 13 to the second electrode 12 can be blocked by arranging the three hole blocking sub-layers. Therefore, through the above arrangement of energy levels, the number of electrons and the number of holes in the light-emitting layer 13 can both be increased, so that more electrons and holes can be recombined in the light-emitting layer 13 for emitting light, thereby improving the light-emitting efficiency of the OLED 10. Meanwhile, since more electrons are recombined in the light-emitting layer 13, the number of un-recombined electrons is reduced, the damage of electrons to the films between the light-emitting layer 13 and the first electrode 11 and the interface between the adjacent films can be reduced, the performance degradation of the films and the performance degradation of the interface between the adjacent films can be slowed, so that the service life of the OLED 10 can be improved.

Figure 4:
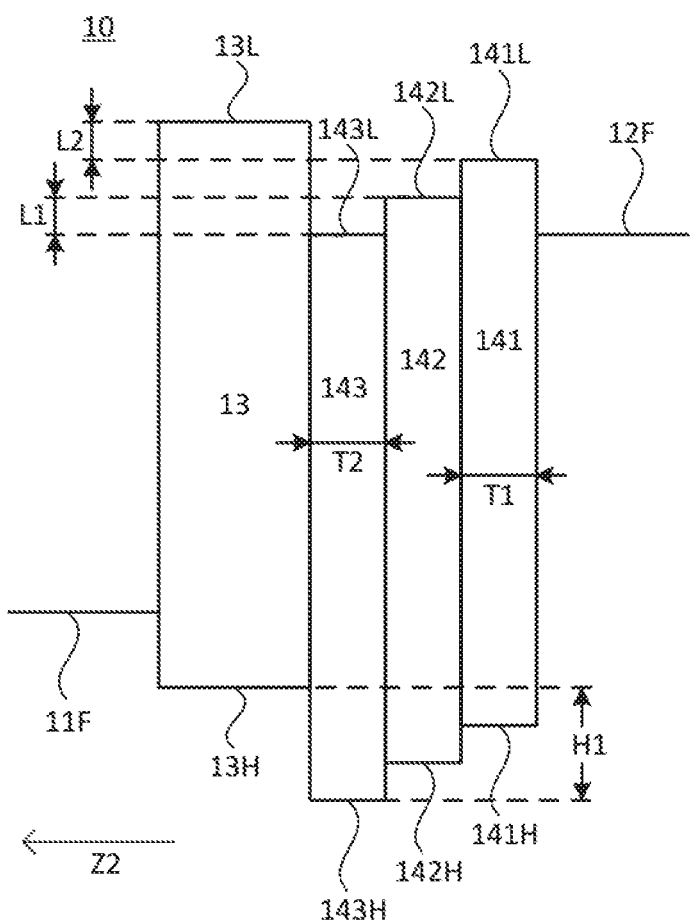
FIG. 4 is a schematic diagram of an energy level structure of an OLED according to another embodiment.

FIG. 4 is a schematic diagram of an energy level structure of an OLED according to another embodiment. Referring to FIG. 4, along a direction Z2 from the second electrode 12 to the light-emitting layer 13, the LUMO energy level decreases sequentially in the at least two hole blocking sub-layers (exemplarily, the OLED 10 shown in FIG. 4 includes three hole blocking sub-layers, which are separately shown as the first hole blocking sub-layer 141, the second hole blocking sub-layer 142 and the third hole blocking sub-layer 143), and the HOMO energy level decreases sequentially in the at least two hole blocking sub-layers (shown as the first hole blocking sub-layer 141, the second hole blocking sub-layer 142 and the third hole blocking sub-layer 143 in FIG. 4); and the LUMO energy level of any one of the at least two hole blocking sub-layers is lower than the LUMO energy level of the light-emitting layer 13.

The LUMO energy level 141L of the first hole blocking sub-layer 141 is higher than the LUMO energy level 142L of the second hole blocking sub-layer 142, and the LUMO energy level 142L of the second hole blocking sub-layer 142 is higher than the LUMO energy level 143L of the third hole blocking sub-layer 143; meanwhile, the LUMO energy level 141L of the first hole blocking sub-layer 141 is higher than the Fermi energy level 12F of the second electrode 12, and the LUMO energy level 141L of the first hole blocking sub-layer 141 is lower than the LUMO energy level 13L of the light-emitting layer 13. The HOMO energy level 141H of the first hole blocking sub-layer 141 is higher than the HOMO energy level 142H of the second hole blocking sub-layer 142, and the HOMO energy level 142H of the second hole blocking sub-layer 142 is higher than the HOMO energy level 143H of the third hole blocking sub-layer 143; meanwhile, the HOMO energy level 143H of the third hole blocking sub-layer 143 is lower than the HOMO energy level 13H of the light-emitting layer 13, and the HOMO energy level 13H of the light-emitting layer 13 is lower than the Fermi energy level 11F of the first electrode 11.

With this arrangement, although an energy level difference between the LUMO energy level 143L of the third hole blocking sub-layer 143 and the LUMO energy level 13L of the light-emitting layer 13 is large, since the LUMO energy level of the hole blocking layer is divided into the stepwise changing LUMO energy level which decreases sequentially in the three hole blocking sub-layers along the direction Z2 from the second electrode 12 to the light-emitting layer 13, the electrons can be very easily transported from the LUMO energy level 141L of the first hole blocking sub-layer 141 to the LUMO energy level 143L of the third hole blocking sub-layer 143, so that a large number of electrons are accumulated at the LUMO energy level 143L of the third hole blocking sub-layer 143. Therefore, when the electrons are transported from the LUMO energy level 143L of the third hole blocking sub-layer 143 to the LUMO energy level 13L of the light-emitting layer 13, the base number of electrons to be transported is large, so that many electrons are still injected into the light-emitting-layer 13. Meanwhile, the transport of holes from the light-emitting layer 13 to the second electrode 12 can also be effectively blocked by arranging the three hole blocking sub-layers. Therefore, through the above arrangement of energy levels, the number of electrons and the number of holes in the light-emitting layer 13 can both be increased, so that more electrons and holes can be recombined in the light-emitting layer 13 for emitting light, thereby improving the light-emitting efficiency of the OLED 10. Meanwhile, since more electrons are recombined in the light-emitting layer 13, the number of un-recombined electrons is reduced, the damage of electrons to the films between the light-emitting layer 13 and the first electrode 11 and the interface between the adjacent films can be reduced, the performance degradation of the films and the performance degradation of the interface between the adjacent films can be slowed, so that the service life of the OLED 10 can be improved.

FIG. 3 and FIG. 4 merely exemplarily show an energy level structure of the OLED 10 provided by the present application by using an example in which the hole blocking layer includes three hole blocking sub-layers, which is not to limit the OLED 10 provided by the embodiments of the present application. In other implementations, the energy level structure of the OLED 10 may also be set according to the practical requirements of the OLED 10, which is not limited in the embodiments of the present application.

Still referring to FIG. 3 or FIG. 4, an energy level difference L1 between LUMO energy levels of two adjacent hole blocking sub-layers satisfies: $L1 \leq 0.15$ eV.

With this arrangement, electrons can be efficiently transported through the hole blocking sub-layers of the hole blocking layer 14, thereby facilitating an increase of the number of electrons at the LUMO energy level 13L of the light-emitting layer 13.

Optionally, the energy level difference L1 between the LUMO energy levels of the two adjacent hole blocking sub-layers satisfies: $L1 \leq 0.1$ eV. With this arrangement, the energy level difference between the LUMO energy levels of the two adjacent hole blocking sub-layers can be reduced, thereby facilitating the increase of the number of electrons at the LUMO level 13L of the light-emitting layer 13, and further facilitating an increase of the service life of the OLED 10.

Still referring to FIG. 3 or FIG. 4, an energy level difference L2 between the LUMO energy level 13L of the light-emitting layer 13 and the highest LUMO energy level among the LUMO energy levels of the at least two hole blocking sub-layers (shown as the first hole blocking sub-layer 141, the second hole blocking sub-layer 142 and the third hole blocking sub-layer 143 in FIG. 3 and FIG. 4) satisfies: $L2 \leq 0.1$ eV; where a hole-blocking sub-layer with the highest LUMO energy level is one of the at least two hole-blocking sub-layers whose LUMO energy level is closest to the LUMO energy level of the light-emitting layer 13. With this arrangement, the electrons can be efficiently transported from the hole blocking layer 14 to the light-emitting layer 13, which also facilitates the increase of the number of electrons at the LUMO energy level 13L of the light-emitting layer 13.

The embodiment of the present application merely exemplarily shows that the energy level difference L2 between the LUMO energy level 13L of the light-emitting layer 13 and the highest LUMO energy level among the LUMO energy levels of the at least two hole blocking sub-layers has the value range: $L2 \leq 0.1$ eV, which is not to limit the OLED 10 provided by the present embodiment. In other implementations, a value range of the energy level difference L2 between the LUMO energy level 13L of the light-emitting layer 13 and the highest LUMO energy level among the LUMO energy levels of the at least two hole blocking sub-layers may be set according to the practical requirements of the OLED 10, and exemplarily, the value range may be $L2 \leq 0.08$ eV or may be $L2 \leq 0.05$ eV, which is not limited in the present embodiment.

Still referring to FIG. 3 or FIG. 4, in the hole blocking layer 14, an energy level difference H1 between a HOMO energy level of at least one hole blocking sub-layer and the HOMO energy level 13H of the light-emitting layer 13 has a value range: $0.2$ eV $\leq H1 \leq 0.5$ eV.

With this arrangement, by increasing the energy level difference between the HOMO energy level 13H of the light-emitting layer 13 and the HOMO energy level of the at least one hole blocking sub-layer, a difficulty in transporting holes from the light-emitting layer 13 to the hole blocking layer 14 can be increased, that is, the number of holes transported from the light-emitting layer 13 to the hole blocking layer 14 can be reduced, so that more holes can be confined in the light-emitting layer 13, thereby facilitating an increase of the number of holes in the light-emitting layer 13.

When the light-emitting layer 13 is made of the host material and the guest material the LUMO energy level 13L of the light-emitting layer 13 may also be understood as a LUMO energy level of the guest material, and the HOMO energy level 13H of the light-emitting layer 13 may also be understood as a HOMO energy level of the guest material.

The embodiment of the present application merely exemplarily shows that a value range of the energy level difference H1 between the HOMO energy level of the at least one hole blocking sub-layer and the HOMO energy level 13H of the light-emitting layer 13 is $0.2$ eV $\leq H1 \leq 0.5$ eV, which is not to limit the OLED 10 provided by the present embodiment. In other implementations, a value range of the energy level difference H1 between the HOMO energy level of the at least one hole blocking sub-layer and the HOMO energy level 13H of the light-emitting layer 13 may be set according to the practical requirements of the OLED 10, and exemplarily, the value range may be $0.3$ eV $\leq H1 \leq 0.4$ eV, or may be $0.35$ eV $\leq H1 \leq 0.45$ eV, which is not limited in the present embodiment.

In the embodiment, still referring to FIG. 3 or FIG. 4, a thickness T1 of any one of the at least two hole blocking sub-layers has a value range: $0$ nm $< T1 \leq 5$ nm.

In this way, the hole blocking sub-layer is configured to have a smaller thickness, and a width of the hole blocking sub-layer in an electron transport direction (which may be understood as the direction from the second electrode 12 to the light-emitting layer 13) can be reduced, so that the electrons stay at a LUMO energy level of each hole blocking sub-layer for less time, which is conducive to reducing losses of the electrons in the hole blocking layer and further facilitates the injection of more electrons into the LUMO energy level 13L of the light-emitting layer 13. In addition, the hole blocking sub-layer with the smaller thickness is arranged, which is also conducive to reducing a thickness of the hole blocking layer, and thereby reduces an overall thickness of the OLED 10, and facilitates the lightening and thinning of a display panel or a display device when the OLED 10 is applied to the display panel or the display device.

The embodiment of the present application merely exemplarily shows that the thickness T1 of any one hole blocking sub-layer has the value range: $0$ nm $< T1 \leq 5$ nm, which is not to limit the OLED 10 provided by the present embodiment. In other implementations, a value range of the thickness T1 of the hole blocking sub-layer may be set according to the practical requirements of the OLED 10, and exemplarily, the value range may be $0$ nm $< T1 \leq 3.5$ nm, or may be $0$ nm $< T1 \leq 2.5$ nm, which is not limited in the present embodiment.

Optionally, a thickness T2 of a hole blocking sub-layer which abuts against the light-emitting layer 13 has a value range: $2$ nm $\leq T2 \leq 3$ nm.

In this way, the hole blocking sub-layer which abuts against the light-emitting layer 13 is configured to have a smaller thickness, and a width of the hole blocking sub-layer which abuts against the light-emitting layer in the electron transport direction (which may be understood as the direction from the second electrode 12 to the light-emitting layer 13) can be reduced, so that the electrons stay at the LUMO energy level of the hole blocking sub-layer which abuts against the light-emitting layer 13, which is conducive to reducing losses of the electrons in the hole blocking sub-layer which abuts against the light-emitting layer 13 and further facilitates the injection of more electrons into the LUMO energy level 13L of the light-emitting layer 13.

The embodiment of the present application merely exemplarily shows that the thickness T2 of the hole blocking sub-layer which abuts against the light-emitting layer 13 has the value range: $2$ nm $\leq T2 \leq 3$ nm, which is not to limit the OLED 10 provided by the present embodiment. In other implementations, a value range of the thickness T2 of the hole blocking sub-layer which abuts against the light-emitting layer 13 may be set according to the practical requirements of the OLED 10, and exemplarily, the value range may be $2.3$ nm $\leq T2 \leq 2.8$ nm, or may be $2.2$ nm $\leq T2 \leq 2.5$ nm, which is not limited in the present embodiment.

In conjunction with the schematic diagram of the energy level structure of the OLED 10 shown in FIG. 4, the third hole blocking sub-layer 143 abuts against the light-emitting layer 13, and the third hole blocking sub-layer 143 is configured to have the smaller thickness, which may be considered that some electrons may be directly transported from the LUMO energy level 142L of the second hole blocking sub-layer 142 to the LUMO energy level 13L of the light-emitting layer 13, can increase an equivalent LUMO energy level of the entire hole blocking layer. Therefore, the energy level difference between the hole blocking layer and the light-emitting layer can be reduced, and the transport of electrons from the hole blocking layer to the light-emitting layer is facilitated, thereby facilitating the increase of the number of electrons in the light-emitting layer 13.

Figure 5:
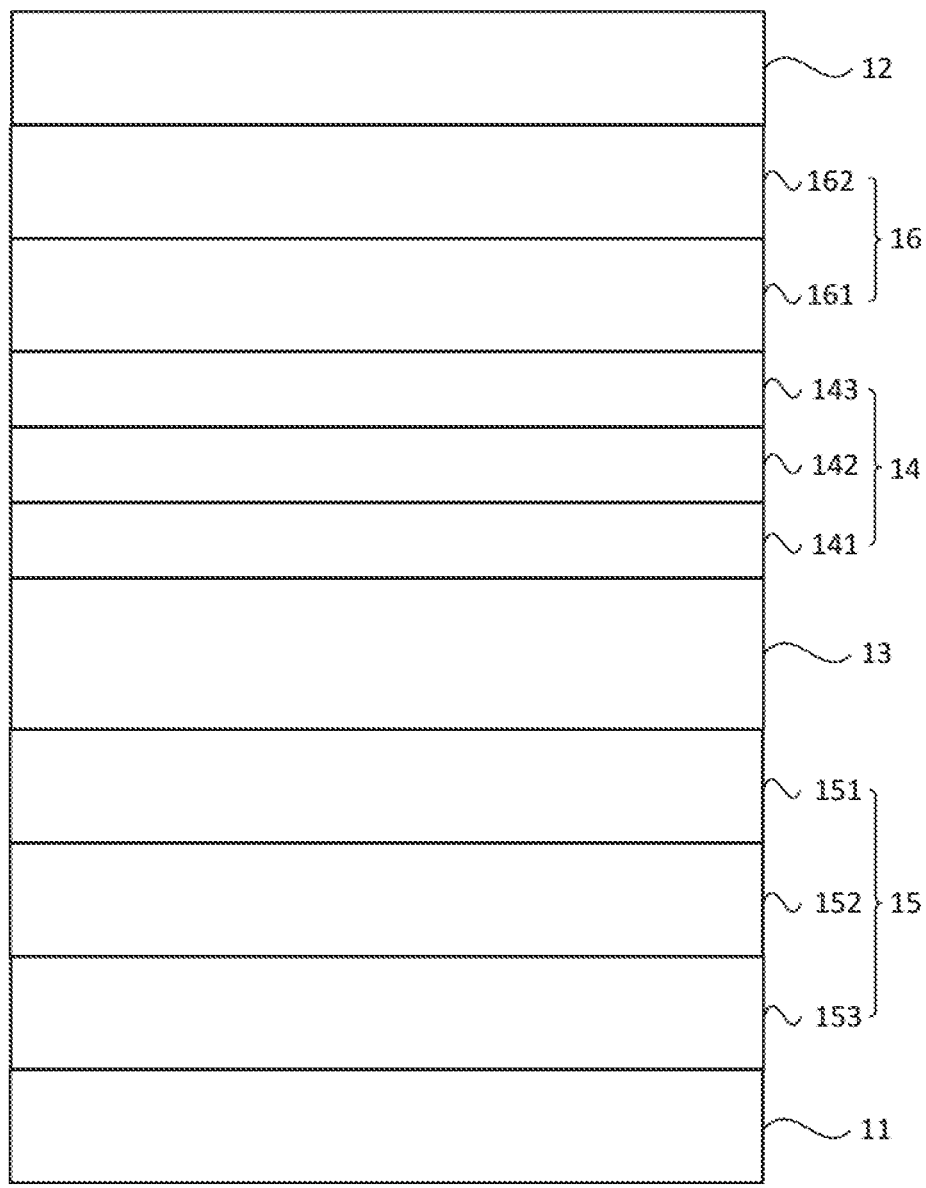
FIG. 5 is a structural diagram of another OLED according to an embodiment.

FIG. 5 is a structural diagram of another OLED according to an embodiment of the present application. Referring to FIG. 5, the OLED 10 may further include a first carrier functional layer 15 and a second carrier functional layer 16, where the first carrier functional layer 15 is disposed between the first electrode 11 and the light-emitting layer 13, and the second carrier functional layer 16 is disposed between the hole blocking layer 14 and the second electrode 12.

The first carrier functional layer 15 may be a hole-type auxiliary functional layer, and may have a multilayer structure including, for example, a hole injection layer a hole transport layer and an electron blocking layer. In FIG. 5, it is exemplarily configured that the first carrier functional layer 15 includes a hole injection layer 153, a hole transport layer 152 and an electron blocking layer 151. The second carrier functional layer 16 may be an electron-type auxiliary functional layer, and may also have a multilayer structure including, for example, an electron injection layer and an electron transport layer. In FIG. 5, it is exemplarily configured that the second carrier function layer 16 includes an electron injection layer 162 and an electron transport layer 161.

Exemplarily, a material of the hole injection layer 153 may be at least one of copper phthalocyanine (CuPC), tio-phthalocyanine (TiOPC), 4,4',4''-tris (3-methylphenylanilino) triphenylamine (m-MTDATA) or 4,4',4''-tris [N-(naphthalen-2-yl)-N-phenyl-amino)]triphenylamine (2T-NANA). A material of the hole transport layer 152 may be at least one of N,N'-diphenyl-N,N'-bis (3-methylphenyl)-1,1'-biphenyl-4,4'-diamine (TPD), N,N'-diphenyl-N, N'-(1-naphthyl)-1,1'-biphenyl-4,4'-diamine (NPB) or poly (9-vinylcarbazole) (PVK). A material of the electron blocking layer 151 may be N,N'-diphenyl-N,N'-bis (3-methylphenyl)-1,1'-biphenyl-4,4'-diamine (TCTA). A material of the electron injection layer 162 may be at least one of lithium fluoride (LiF), Yttrium Fluoride (YF), magnesium phosphide (MgP), magnesium fluoride (MgF2) or aluminum oxide (Al2O3). A material of the electron transport layer 161 may be at least one of 8-hydroxyquinoline aluminum (Alq3), tris (2-methyl-8-hydroxyquinoline) (Almq3), 1,3,5-tris (1-phenyl-1H-benzimidazol-2-yl) benzene (TPBi), 3-(biphenyl-4-yl)-5-(4-tert-butylphenyl)-4-phenyl-4H-1, 2,4-Triazole (TAZ), 1,3-bis [2-(p-tert-butylphenyl)-1,3,4-oxadiazolyl-5] benzene (OXD), 2-biphenyl-5-(4-tert-butylphenyl)-1,3,4-diazole (PBD) or 2,5-bis (1-naphthyl)-1, 3,4-diazole (BND).

The first carrier functional layer 15 and the second carrier functional layer 16 may further include a carrier functional layer material known to those skilled in the art, which is neither described nor limited in the embodiments of the present application. The first carrier functional layer 15 and the second carrier functional layer 16 may be formed by evaporation, spraying, inkjet printing or other film forming manners known to those skilled in the art, and the first carrier functional layer 15 and the second carrier functional layer 16 may be formed in the same manner or in different manners, which is not limited in the embodiments of the present application.

Figure 6:
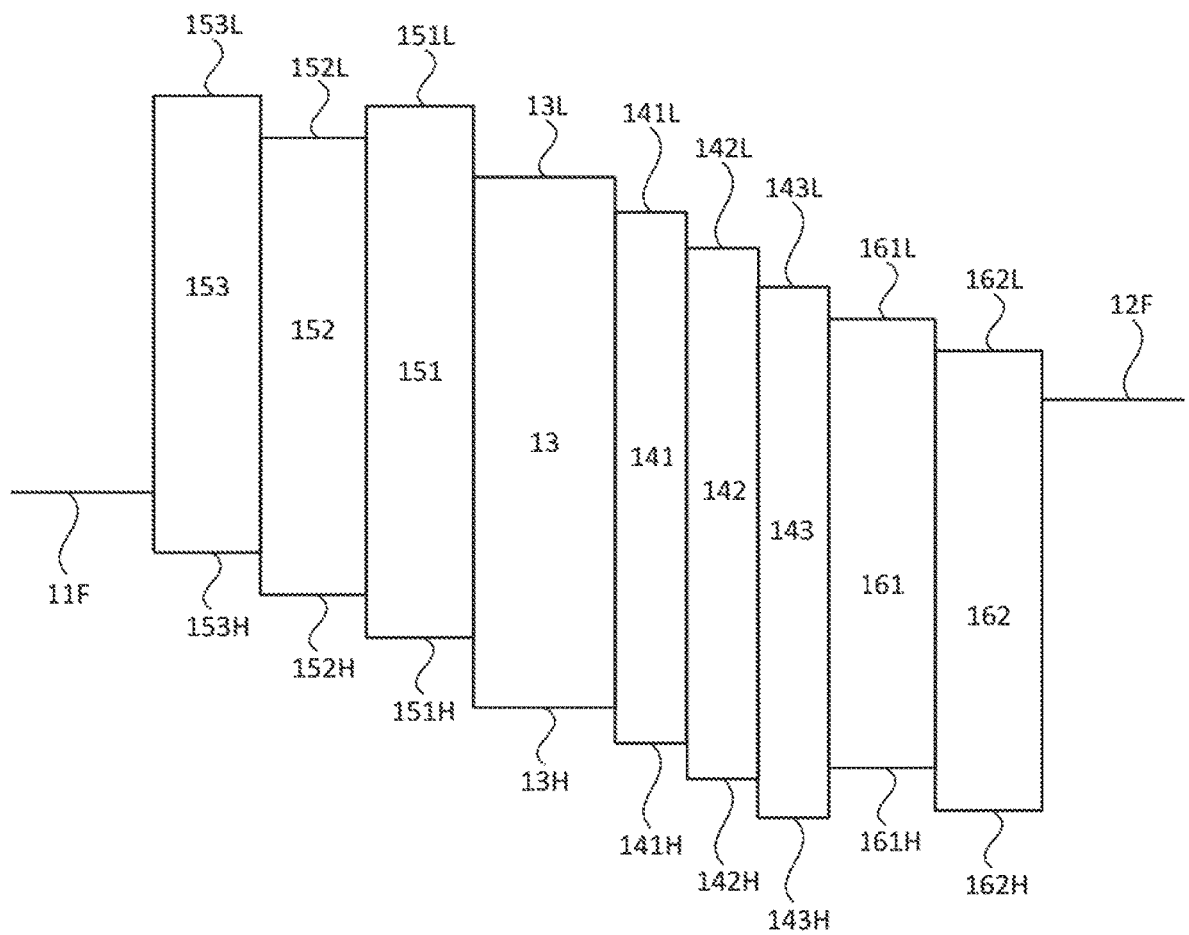
FIG. 6 is a schematic diagram of an energy level structure of an OLED according to another embodiment.

FIG. 6 is a schematic diagram of an energy level structure of an OLED according to another embodiment of the present application. In conjunction with FIG. 5 and FIG. 6, in the OLED 10, LUMO energy levels of the multiple films are, in an ascending order, a LUMO energy level 162L of the electron injection layer 162, a LUMO energy level 161L of the electron transport layer 161, the LUMO energy level of the hole blocking layer (including the LUMO energy level 143L of the third hole blocking sub-layer 143, the LUMO energy level 142L of the second hole blocking sub-layer 142 and the LUMO energy level 141L of the first hole blocking sub-layer 141, which are sequentially arranged), the LUMO energy level 13L of the light-emitting layer 13 and a LUMO energy level 151L of the electron blocking layer 151, where a LUMO energy level 152L of the hole transport layer 152 may be lower than the LUMO energy level 151L of the electron blocking layer 151, and a LUMO energy level 153L of the hole injection layer 153 may be higher than the LUMO energy level 152L of the hole transport layer 152; the LUMO energy level 162L of the electron injection layer 162 is higher than the Fermi energy level 12F of the second electrode 12. In this way, when the driving current is provided for the OLED 10, the electrons are transported from the second electrode 12F and injected into the light-emitting layer 13, and meanwhile, since an energy level difference between the LUMO energy level 151L of the electron blocking layer 151 and the LUMO energy level 13L of the light-emitting layer 13 is large, the electrons do not easily cross the LUMO energy level of the electron blocking layer 151, so that more electrons are confined in the light-emitting layer 13, and the number of electrons in the light-emitting layer 13 can be increased.

In the OLED 10, HOMO energy levels of the multiple films are, in a descending order, a HOMO energy level 153H of the hole injection layer 153, a HOMO energy level 152H of the hole transport layer 152, a HOMO energy level 151H of the electron blocking layer 151, the HOMO energy level 13H of the light-emitting layer 13, the HOMO energy level of the hole blocking layer (including the HOMO energy level 141H of the first hole blocking sub-layer 141, the HOMO energy level 142H of the second hole blocking sub-layer 142 and the HOMO energy level 143H of the third hole blocking sub-layer, which are sequentially arranged), where a HOMO energy level 161H of the electron transport layer 161 may be higher than the HOMO energy level 143H of the third hole blocking sub-layer 143, and a HOMO energy level 162H of the electron injection layer 162 may be lower than the HOMO energy level 161H of the electron transport layer 161; the Fermi energy level 11F of the first electrode 11 is higher than the HOMO energy level 153H of the hole injection layer 153. In this way, when the driving current is provided for the OLED 10, holes are transported from the first electrode 11 and injected into the light-emitting layer 13, and a large energy level difference is provided between the HOMO energy level of the hole blocking layer and the HOMO energy level of the light-emitting layer 13, so that the transport of holes from the light-emitting layer 13 to the second electrode 12 can be blocked, more holes are confined in the light-emitting layer 13, and the number of holes in the light-emitting layer 13 can be increased.

Therefore, through the above arrangement of LUMO energy levels and HOMO energy levels in the OLED 10, the number of electrons and the number of holes in the light-emitting layer 13 can be increased, and thus more electrons and holes are recombined in the light-emitting layer 13 for emitting light, thereby improving the light-emitting efficiency of the OLED 10. Meanwhile, since more electrons are recombined in the light-emitting layer 13, the damage of electrons to the films between the light-emitting layer 13 and the first electrode 11 and the interface between the adjacent films can be reduced, the performance degradation of the films and the performance degradation of the interface between the adjacent films can be slowed, so that the service life of the OLED 10 can be improved.

Exemplarily, a work function 12F of the second electrode 12 may have a value range: |12F|≤4.3 eV; a work function 162F of the electron injection layer 162 satisfies: |162F|≤3.6 eV; the LUMO energy level 161L of the electron transport layer 161 may have a value range: 2.7 eV≤|161L|≤3.2 eV and may be 3.0 eV, and the HOMO energy level 161H of the electron transport layer 161 may have a value range: 5.9 eV≤|161H|≤6.1 eV, and may be 6.0 eV; the LUMO energy level 143L of the third hole blocking sub-layer 143 may have a value range: 2.7 eV≤|143L|≤3.2 eV, and may be 2.9 eV, and the HOMO energy level 143H of the third hole blocking sub-layer 143 may have a value range: 5.9 eV≤|143H|≤6.4 eV, and may be 6.20 eV; the LUMO energy level 142L of the second hole blocking sub-layer 142 may have a value range: 2.7 eV≤|142L|≤3.2 eV and may be 2.80 eV, and the HOMO energy level 142H of the second hole blocking sub-layer 142 may have a value range: 5.9 eV≤|142H|≤6.4 eV, and may be 6.10 eV; the LUMO energy level 141L of the first hole blocking sub-layer 141 may have a value range: 2.7 eV≤|141L|≤3.2 eV, and may be 2.70 eV, and the HOMO energy level 141H of the first hole blocking sub-layer 141 may have a value range: 5.8 eV≤|141H|≤6.2 eV, and may be 6.0 eV; the LUMO energy level 13L of the light-emitting layer 13 may have a value range: 2.5 eV≤|13L|≤3.1 eV, and may be 2.6 eV and the HOMO energy level 13H of the light-emitting layer 13 may have a value range: 5.7 eV≤|13H|≤6.1 eV, and may be 5.8 eV; the LUMO energy level 151L of the electron blocking layer 151 may have a value range: 2.1 eV≤|151L|≤2.5 eV, and may be 2.4 eV and the HOMO energy level 151H of the electron blocking layer 151 may have a value range: 5.6 eV≤|151H|≤5.9 eV, and may be 5.75 eV; the LUMO energy level 152L of the hole transport layer 152 may have a value range: 2.4 eV≤|152L|≤3.0 eV, and may be 2.5 eV, and the HOMO energy level 152H of the hole transport layer 152 may have a value range: 5.5 eV≤|152H|≤6.0 eV and may be 5.7 eV; a work function 11F of the first electrode 11 satisfies: |11F|≥4.2 eV. The above are merely exemplary descriptions rather than limitations on the OLED 10 provided by the embodiments of the present application.

The ranges of energy levels of each film are merely exemplary descriptions, rather than limitations on the OLED 10 provided by the embodiments of the present application. In other implementations, the ranges of the energy levels of each film of the OLED 10 may be set according to the practical requirements of the OLED 10, which are not limited in the embodiments of the present application.

The embodiment of the present application exemplarily shows a comparison table of a group of light-emitting characteristics between an OLED in the related art and the OLED provided in the present application below, which is referred to Table 1.

TABLE 1

Comparison table of light-emitting characteristics between the OLED in the related art and the OLED provided in the present application

| Device | Op. V (V) | Eff. 1 (cd/A) | Eff. 2 (lm/W) | CIE (x, y) | | Peak (nm) | BI | LT97 (h) |
|---|---|---|---|---|---|---|---|---|
| D1 | 3.99 | 7.41 | 0.1424 | 0.0494 | | 460 | 150 | 120 |
| D2 | 4.05 | 7.40 | 0.1407 | 0.0501 | | 400 | 148 | 180 |

Device D1 represents the OLED in the related art, and device D2 represents the OLED provided in the present application. Similarities between device D1 and device D2 include the following: the first electrode is made of ITO, has a thickness of 10 am, and its work function is 4.3 eV; the hole injection layer has a thickness of 10 nm; the hole transport layer has a thickness of 120 nm; the electron blocking layer has a thickness of 5 nm; the light-emitting layer has a thickness of 20 nm; the electron transport layer has a thickness of 30 nm; the electron injection layer has a thickness of 1 nm and the second electrode is made of a metal material and has a thickness of 13 nm to 20 nm. Differences between device D1 and device D2 lie in that the hole blocking layer of device D1 has a single-layer structure, a thickness of 5 nm, a LUMO energy level at a position of 2.8 eV, and a HOMO energy level at a position of 6.1 eV; and that the hole blocking layer of device D2 includes two hole blocking sub-layers, which are the first hole blocking sub-layer and the second hole blocking sub-layer where the first hole blocking sub-layer is disposed between the light-emitting layer and the second hole blocking sub-layer, the first hole blocking sub-layer has a thickness of 3 nm, a LUMO energy level at a position of 2.8 eV, and a HOMO energy level at a position of 6.1 eV and the second hole blocking sub-layer has a thickness of 2 nm, a LUMO energy level at a position of 2.7 eV, and a HOMO energy level at a position of 6.0 eV. On the basis of the film structures of device D1 and device D2, the light-emitting characteristics of the two devices are tested, and test results shown in Table 1 are obtained.

Op.V represents an operating voltage in Volts (V); Eff.1 represents current efficiency in candelas per ampere (cd/A); Eff.2 represents luminous efficiency in lumens per watt (lm/W); CIE (x,y) represents a color coordinate; peak represents a peak position in nanometers (nm); BI represents a blue light factor, and may be obtained by dividing the current efficiency by the color coordinate, where the larger the blue light factor, the better performance the device has; LT97 represents the service life of the device in hours (h) and represents a service life value of the device obtained by a constant current test at 1200 nit.

As can be seen from comparative data of the light-emitting characteristics of the OLEDs in Table 1, after the single-layer hole blocking layer in the structure of the OLED is changed to the hole blocking layer including at least two hole blocking sub-layers in the present application, device D1 and device D2 have consistent performance in terms of the operating voltage, current efficiency, luminous efficiency, color coordinate, peak position, and blue light factor, and in terms of the service life, the service life of 120 h of device D1 is increased to the service life of 180 h of device D2. Therefore, compared with the related at, the present application can increase the service life of the OLED from 120 h to 180 h, that is, increase the service life by 50% on the premise that other light-emitting characteristics of the OLED are ensured to be basically unchanged.

The comparisons between device D1 and device D2 are merely exemplary descriptions rather than limitations on the OLED provided by the embodiments of the present application.

Figure 7:
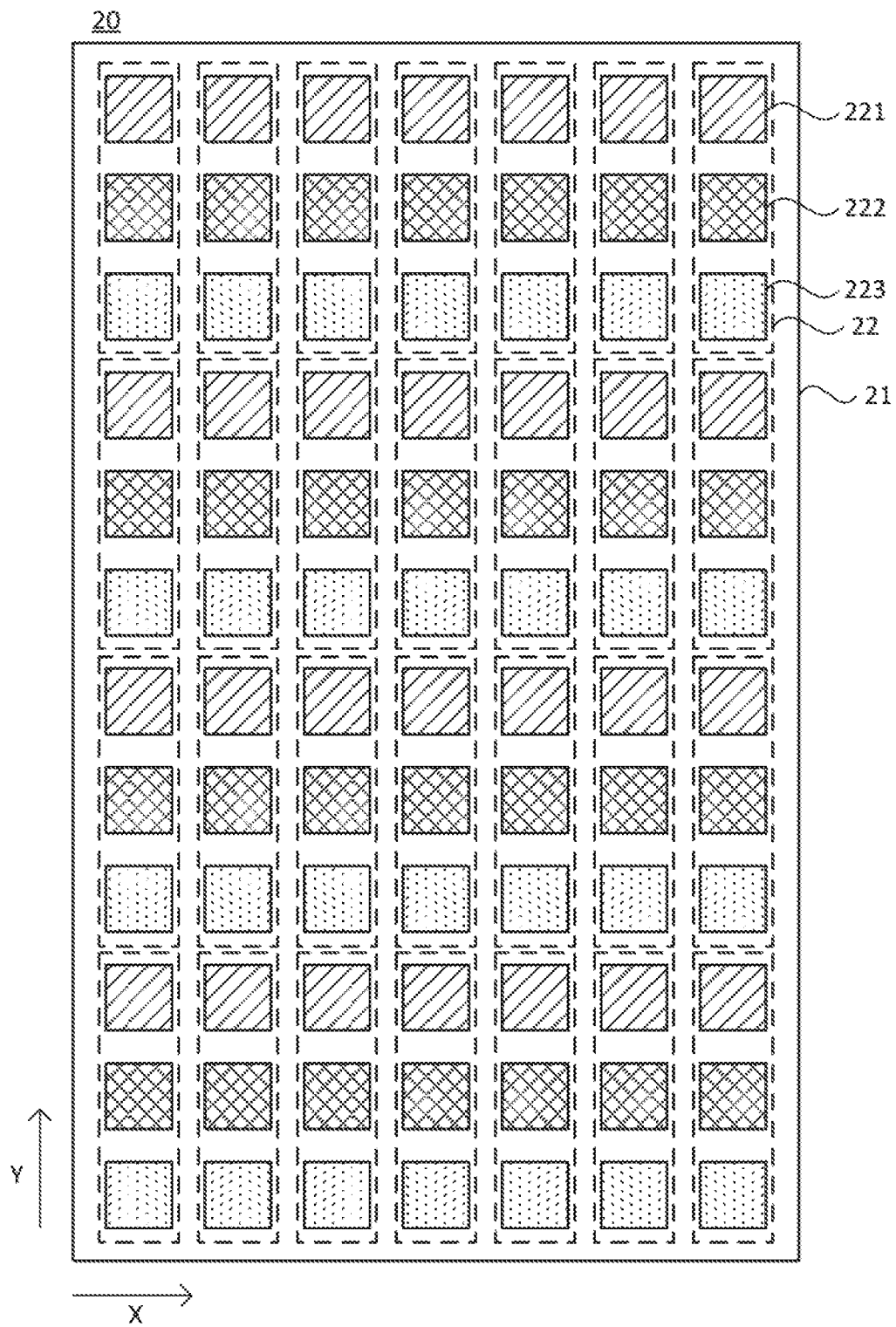
FIG. 7 is a structural diagram of a display panel according to an embodiment.

On the basis of the above-mentioned embodiments, the embodiments of the present application further provide a display panel. Exemplarily. FIG. 7 is a structural diagram of a display panel according to an embodiment of the present application. Referring to FIG. 7, a display panel 20 includes a substrate 21 and a plurality of pixel units 22 arranged in an array on a side of the substrate 21, where each of the plurality of pixel units 22 includes any one of the OLEDs provided by the above-mentioned embodiments. The display panel 20 provided by the embodiment of the present application includes any one of the above-mentioned OLEDs, and therefore, the display panel 20 also has the beneficial effects of the above-mentioned OLEDs, which may be referred to the above and not repeated herein.

The substrate 21 may be an array substrate for driving the pixel units 22 to emit light.

Exemplarily. FIG. 7 shows a row direction X and a column direction Y (a plane where the row direction X and the column direction Y are located shown in FIG. 7 is a plane where the substrate 21 is located; a direction Z1 from a light-emitting layer 13 to a second electrode 12 and a direction Z2 from the second electrode 12 to the light-emitting layer 13 shown in FIG. 2 each are perpendicular to the plane where the substrate 21 is located), and shows pixel units 22 arranged in 7 columns and 4 rows, where each of the pixel units 22 may include a blue sub-pixel 221, a red sub-pixel 222 and a green sub-pixel 223, and meanwhile, sub-pixels in each pixel unit 22 are arranged in an order of the blue sub-pixel 221, the red sub-pixel 222 and the green sub-pixel 223 along the column direction Y, which are merely exemplary descriptions rather than limitations of the display panel 20 provided by the embodiments of the present application. In other implementations, an array arrangement of the pixel units 22, and the number of blue sub-pixels 221, the number of red sub-pixels 222, the number of green sub-pixels 223 and an arrangement of the blue sub-pixel 221, the red sub-pixel 222 and the green sub-pixel 223 in each pixel unit 22 may be set according to practical requirements of the display panel 20, which are not limited in the embodiments of the present application.

In addition, the embodiments of the present application do not limit a specific type of the display panel 20, and the present disclosure may be applied to any display panel related to the transport process of electrons and holes. An exemplary display panel may be an OLED display panel, a Quantum Dot Light Emitting diodes (QLED) display panel, or other display panels known to those skilled in the art.

What is claimed is:

1. An organic light-emitting diode, comprising:
   a first electrode and a second electrode disposed oppositely with each other;
   a light-emitting layer disposed between the first electrode and the second electrode; and
   a hole blocking layer disposed between the light-emitting layer and the second electrode;
   wherein the hole blocking layer comprises at least two hole blocking sub-layers which are stacked, and a lowest unoccupied molecular orbital (LUMO) energy level decreases sequentially in the at least two hole blocking sub-layers;
   wherein an energy level difference L1 between the LUMO energy level of two adjacent hole blocking sub layers among the at least two hole blacking sub layers satisfies: L1≤0:15 eV;
   and wherein
   along a direction from the light-emitting layer to the second electrode, the LUMO energy level decreases sequentially in the at least two hole blocking sub-layers, a highest occupied molecular orbital (HOMO) energy level decreases sequentially in the at least two hole blocking sub-laver, and the LUMO energy level of each of the at least two hole blocking sub-layers is lower than a LUMO energy level of the light-emitting layer, wherein the LUMO energy level of each of the at least two hole blocking sub-layers is higher than a Fenn energy level of the second electrode, a HOMO energy level of the light-emitting layer is lower than a Fermi energy level of the first electrode and a HOMO energy level of each of the at least two hole blocking sub-layers is lower than the HOMO energy level of the light-emitting layer: or
   along a direction from the second electrode to the light-emitting layer, the LUMO energy level decreases sequentially in the at least two hole blocking sub-layers, a HOMO energy level decreases sequentially in the at least two hole blocking sub-layers, and the LUMO energy level of each of the at least two hole blocking sub-layers is lower than a LUMO energy level of the light-emitting layer, wherein a LUMO energy level of at least one of the at least two hole blocking sub-layers is higher than a Fermi energy level of the second electrode, a HOMO energy level of each of the al: least two hole blocking sub-layers is lower than HOMO energy level of the light-emitting layer, and the HOMO energy level of the light-emitting layer is lower than a Fermi energy level of the first electrode.

2. The organic light-emitting diode of claim 1, wherein the energy level difference L1 between the LUMO energy level of the two adjacent hole blocking sub-layers among the at least two hole blocking sub-layers satisfies: L1≤0.1 eV.

3. The organic light-emitting diode of claim 1, wherein an energy level difference L2 between the LUMO energy level of the light-emitting layer and the LUMO energy level of one hole blocking sub-layer with a highest LUMO energy level among the at least two hole blocking sub-layers satisfies: L2≤0.1 eV; and the hole blocking sub-layer with the highest LUMO energy level has the LUMO energy level closest to the LUMO energy level of the light-emitting layer.

4. The organic light-emitting diode of claim 3, wherein the energy level difference L2 between the LUMO energy level of the light-emitting layer and the LUMO energy level of the hole blocking sub-layer with the highest LUMO energy level among the at least two hole blocking sub-layers satisfies: L2≤0.08 eV.

5. The organic light-emitting diode of claim 1, wherein in the hole blocking layer, an energy level difference H1 between a highest occupied molecular orbital (HOMO) energy level of at least one of the at least two hole blocking sub-layers and a HOMO energy level of the light-emitting layer has a value range: 0.2 eV≤H1≤0.5 eV.

6. The organic light-emitting diode of claim 5, wherein in the hole blocking layer, the energy level difference H1 between the HOMO energy level of the at least one of the at least two hole blocking sub-layers and the HOMO energy level of the light-emitting layer has a value range: 0.3 eV≤H1≤0.4 eV.

7. The organic light-emitting diode of claim 1, wherein a thickness T1 of each of the at least two hole blocking sub-layers has a value range: 0 nm<T1≤5 nm.

8. The organic light-emitting diode of claim 7, wherein the thickness T1 of each of the at least two hole blocking sub-layers has a value range: 0 nm<T1≤3.5 nm.

9. The organic light-emitting diode of claim 4, wherein a thickness T2 of one of the at least two hole blocking sub-layers which abuts against the light-emitting layer has a value range: 2.3 nm≤T2≤2.8 nm.

10. The organic light-emitting diode of claim 9, wherein the thickness T2 of the one of the at least two hole blocking sub-layers which abuts against the light-emitting layer has a value range: 2.3 nm≤T2≤2.8 nm.

11. The organic light-emitting diode of claim 1, further comprising a first carrier functional layer and a second carrier functional layer; wherein the first carrier functional layer is disposed between the first electrode and the light-emitting layer; and the second carrier functional layer is disposed between the hole blocking layer and the second electrode.

12. A display panel, comprising a substrate and a plurality of pixel units disposed on a side of the substrate and arranged in an array; wherein each of the plurality of pixel units comprises the organic light-emitting diode of claim 1.

13. The organic light-emitting diode of claim 11, wherein the first carrier functional layer 15 is a hole-type auxiliary functional layer, and the first carrier functional layer have a multilayer structure including a hole injection layer, a hole transport layer and an electron blocking layer, and the second carrier function layer includes an electron injection layer and an electron transport layer.

14. The organic light-emitting diode of claim 13, wherein along a direction from the second electrode to the light-emitting layer, the LUMO energy level decreases sequentially in the at least two hole blocking sub-layers, the LUMO energy level of each of the at least two hole blocking sub-layers is lower than a LUMO energy level of the light-emitting layer and the LUMO energy level of each of the at least two hole blocking sub-layers is higher than a LUMO energy level of the electron transport layer; and along the direction from the second electrode to the light-emitting layer, a LUMO energy level of the electron blocking layer, the LUMO energy level of the light-emitting layer, the LUMO energy level of the electron transport layer, a LUMO energy level of the electron injection layer, a Fermi energy level of the second electrode decrease sequentially.

15. The organic light-emitting diode of claim 13, wherein along a direction from the second electrode to the light-emitting layer, the HOMO energy level decreases sequentially in the at least two hole blocking sub-layers, and the HOMO energy level of each of the at least two hole blocking sub-layers is lower than a HOMO energy level of the light-emitting layer; and along a direction from the second electrode to the light-emitting layer, a Fermi energy level of the first electrode, a HOMO energy level of the hole injection layer, a HOMO energy level of the hole transport layer, a HOMO energy level of the electron blocking layer the HOMO energy level of the light-emitting layer decrease sequentially.

* * * * *